(12) United States Patent
Cui

(10) Patent No.: US 10,749,124 B2
(45) Date of Patent: Aug. 18, 2020

(54) FLEXIBLE DISPLAY PANEL AND POLYIMIDE SUBSTRATE THEREOF, AND METHOD FOR FABRICATING THE FLEXIBLE DISPLAY PANEL

(71) Applicant: Wuhan China Star Optoelectronics Technology Co., Ltd., Wuhan, Hubei (CN)

(72) Inventor: Lei Cui, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 320 days.

(21) Appl. No.: 15/747,328

(22) PCT Filed: Nov. 21, 2017

(86) PCT No.: PCT/CN2017/112053
§ 371 (c)(1),
(2) Date: Jan. 24, 2018

(87) PCT Pub. No.: WO2019/029044
PCT Pub. Date: Feb. 14, 2019

(65) Prior Publication Data
US 2020/0083467 A1    Mar. 12, 2020

(30) Foreign Application Priority Data
Aug. 10, 2017  (CN) .......................... 2017 1 0682298

(51) Int. Cl.
*H01L 51/00* (2006.01)
*H01L 27/32* (2006.01)
(Continued)

(52) U.S. Cl.
CPC ........ *H01L 51/0097* (2013.01); *H01L 27/323* (2013.01); *H01L 51/5246* (2013.01); *H01L 51/56* (2013.01); *H01L 2251/5338* (2013.01)

(58) Field of Classification Search
None
See application file for complete search history.

(56) References Cited

U.S. PATENT DOCUMENTS

2004/0004691 A1 * 1/2004 Nakahara .............. G02F 1/1333
                                                              349/158
2011/0267288 A1 * 11/2011 Jeon ...................... G06F 3/0412
                                                              345/173
(Continued)

FOREIGN PATENT DOCUMENTS

CN           101833182 A       9/2010

*Primary Examiner* — J. E. Schoenholtz
(74) *Attorney, Agent, or Firm* — Hemisphere Law, LLC; Zhigang Ma

(57) ABSTRACT

A flexible display panel and a polyimide substrate thereof, and a method for fabricating the flexible display panel are disclosed. The flexible display panel includes a large panel composed of a glass carrier and a polyimide substrate adhering to the glass carrier and displaying effective regional assemblies adhering to the polyimide substrate. A glue layer is formed at the periphery of the displaying effective regional assemblies and formed on the polyimide substrate and used to reinforce the edge of the polyimide substrate after the large panel is cut into a display panel.

12 Claims, 3 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 2013/0273334 A1* | 10/2013 | Lee | C03C 17/34 |
| | | | 428/189 |
| 2015/0303401 A1* | 10/2015 | Yu | H01L 21/02348 |
| | | | 438/26 |
| 2018/0122866 A1* | 5/2018 | Choi | C09J 163/00 |
| 2019/0129219 A1* | 5/2019 | Fujita | G02F 1/13338 |
| 2019/0363304 A1* | 11/2019 | Tanaka | H05B 33/04 |

\* cited by examiner

FLEXIBLE DISPLAY PANEL AND POLYIMIDE SUBSTRATE THEREOF, AND METHOD FOR FABRICATING THE FLEXIBLE DISPLAY PANEL

RELATED APPLICATIONS

The present application is a National Phase of International Application Number PCT/CN2017/112053, filed Nov. 21, 2017, and claims the priority of China Application 201710682298.2, filed Aug. 10, 2017.

FIELD OF THE DISCLOSURE

The disclosure relates to a panel technical field, and more particularly to a flexible display panel and a polyimide substrate thereof, and a method for fabricating the flexible display panel.

BACKGROUND

With the improvement of displaying technology, the technology for active-matrix organic light emitting diode (AMOLED) display screens has been endlessly developed. A number of active-matrix organic light emitting diode display screens start to enter into the market. Flexible display screens for AMOLED technology took the fancy of the public due to the new design and the flexibility of the flexible display screens. Flexible AMOLED display screens will be the mainstream of intelligent terminal screens in the future.

However, the technical key of flexible screens lies in properties of various films when they are bent. The demands for the life and flexibility of the films are very strict and directly affect the practicability of mass production of products. Presently, the polyimide substrate of a flexible display panel is greatly affected by a peeling process. Thus, the flexible display panel has drawbacks described as follows:

During the glass carrier of the flexible display panel peels off the polyimide substrate, the tension of the polyimide substrate will enlarge and extend microcracks caused by cutting to increase the risk for damaging flexible internal traces and film packages.

SUMMARY

A technical problem to be solved by the disclosure is to provide a flexible display panel and a polyimide substrate thereof, and a method for fabricating the flexible display panel, which reinforce the edge of the polyimide substrate after cutting the flexible display panel and control the probability that microcarcks are extended to the interior of the polyimide substrate to increase the yield of products.

An objective of the disclosure is achieved by following embodiments. In particular, the polyimide substrate of a flexible display panel is provided. The flexible display panel comprises a large panel composed of a glass carrier and a polyimide substrate adhering to the glass carrier; and displaying effective regional assemblies adhering to the polyimide substrate; wherein a glue layer is formed at the periphery of the displaying effective regional assemblies, formed on the polyimide substrate, and used to reinforce the edge of the polyimide substrate after the large panel is cut into a display panel.

In an embodiment of the present invention, the glue layer is an ultraviolet glue layer, and the ultraviolet glue layer is formed on three neighboring side regions which are arranged at the periphery of the displaying effective regional assemblies and connected with the polyimide substrate.

In an embodiment of the present invention, the ultraviolet glue layer is formed on the polyimide substrate which is connected with three neighboring side regions arranged at the periphery of the displaying effective regional assemblies.

In an embodiment of the present invention, the displaying effective regional assemblies further comprises: a thin-film transistor (TFT) layer adhering to the polyimide substrate, an organic light-emitting diode (OLED) material layer adhering to the TFT layer, a thin film encapsulation layer, a touch screen layer adhering to the thin film encapsulation layer, an optical adhesive layer adhering to the touch screen layer, and a cover layer adhering to the optical adhesive layer, and the thin film encapsulation layer covers the periphery of the OLED material layer and the sidewall of the TFT layer.

In an embodiment of the present invention, the thin film encapsulation layer adheres to the polyimide substrate.

In an embodiment of the present invention, the ultraviolet glue layer is formed on three neighboring side regions which are arranged at the periphery of the thin film encapsulation layer and connected with the polyimide substrate, and the ultraviolet glue layer is formed on the polyimide substrate which is connected with three neighboring side regions arranged at the periphery of the thin film encapsulation layer.

The method for fabricating a flexible display panel comprises cutting a flexible display panel, the flexible display panel comprises a large panel composed of a glass carrier and a polyimide substrate adhering to the glass carrier; and displaying effective regional assemblies adhering to the polyimide substrate; and coating an ultraviolet glue layer at the periphery of the displaying effective regional assemblies and on the polyimide substrate, so as to reinforce the edge of the polyimide substrate after the large panel is cut into a display panel.

In an embodiment of the present invention, the displaying effective regional assemblies further comprise a thin film encapsulation layer adhering to the polyimide substrate.

In an embodiment of the present invention, the ultraviolet glue layer is coated on three neighboring side regions which are arranged at the periphery of the thin film encapsulation layer and connected with the polyimide substrate, and the ultraviolet glue layer is coated on the polyimide substrate which is connected with three neighboring side regions arranged at the periphery of the thin film encapsulation layer.

The flexible display panel comprises a large panel composed of a glass carrier and a polyimide substrate adhering to the glass carrier; and displaying effective regional assemblies adhering to the polyimide substrate; wherein a glue layer is formed at the periphery of the displaying effective regional assemblies, formed on the polyimide substrate, and used to reinforce the edge of the polyimide substrate after the large panel is cut into a display panel; the displaying effective regional assemblies further comprise: a thin-film transistor (TFT) layer adhering to the polyimide substrate, an organic light-emitting diode (OLED) material layer adhering to the TFT layer, a thin film encapsulation layer, a touch screen layer adhering to the thin film encapsulation layer, an optical adhesive layer adhering to the touch screen layer, and a cover layer adhering to the optical adhesive layer, and the thin film encapsulation layer covers the periphery of the OLED material layer and the sidewall of the TFT layer.

In an embodiment of the present invention, the glue layer is an ultraviolet glue layer as an optical glue layer, and the ultraviolet glue layer is formed on three neighboring side regions which are arranged at the periphery of the displaying effective regional assemblies and connected with the polyimide substrate.

In an embodiment of the present invention, the ultraviolet glue layer is formed on the polyimide substrate which is connected with three neighboring side regions arranged at the periphery of the displaying effective regional assemblies.

In an embodiment of the present invention, the thin film encapsulation layer adheres to the polyimide substrate.

In an embodiment of the present invention, the ultraviolet glue layer is formed on three neighboring side regions which are arranged at tje periphery of the thin film encapsulation layer and connected with the polyimide substrate, and the ultraviolet glue layer is formed on the polyimide substrate which is connected with three neighboring side regions arranged at the periphery of the thin film encapsulation layer.

The flexible display panel and the polyimide substrate, and the method for fabricating the flexible display panel of the present invention have following affects:

1. A glue layer is formed at the periphery of the displaying effective regional assemblies and formed on the polyimide substrate and used to reinforce the edge of the polyimide substrate after the large panel is cut into the display panel, thereby improving the strength of the edge of the polyimide substrate after cutting the flexible display panel.

2. A fabrication process is simplified. The probability that microcracks are extended to the interior of the polyimide substrate is controlled to increase the yield of products and decrease the cost.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
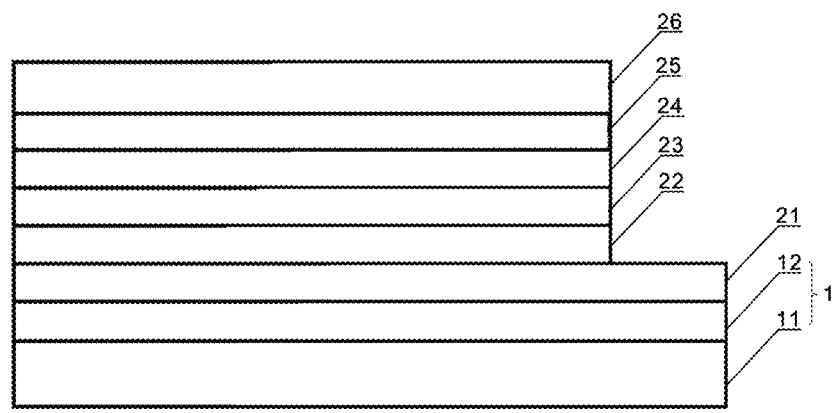
FIG. 1 is a stacked schematic view of a flexible display panel according to an embodiment of the disclosure.
Figure 2:
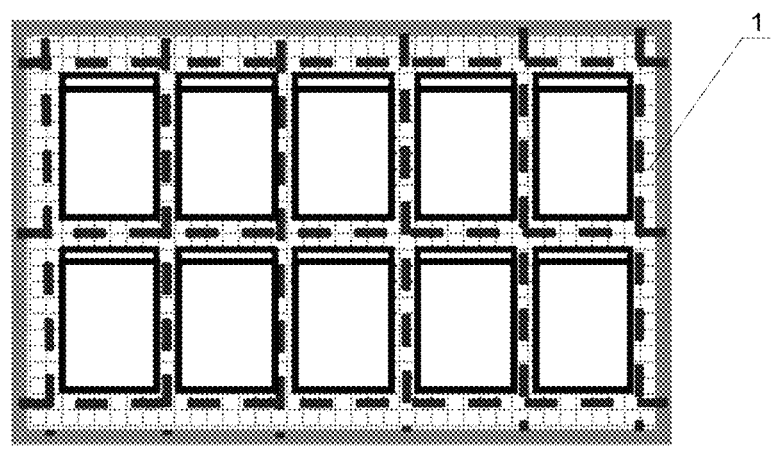
FIG. 2 is a schematic view of dividing a flexible display panel by laser cutting according to another embodiment of the disclosure.
Figure 3:
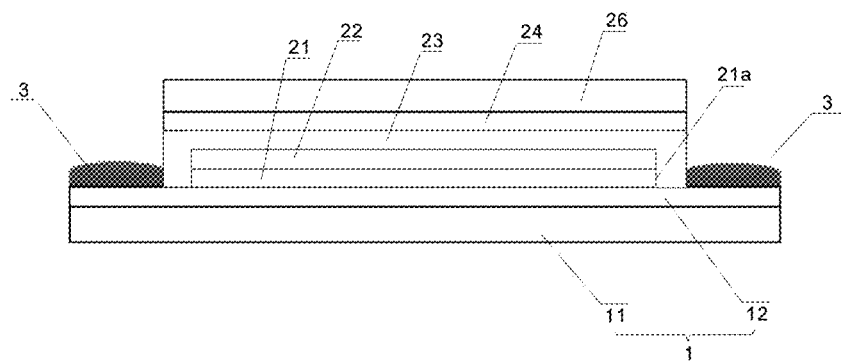
FIG. 3 is a cross-sectional schematic view of a flexible display panel according to an embodiment of the disclosure.
Figure 4:
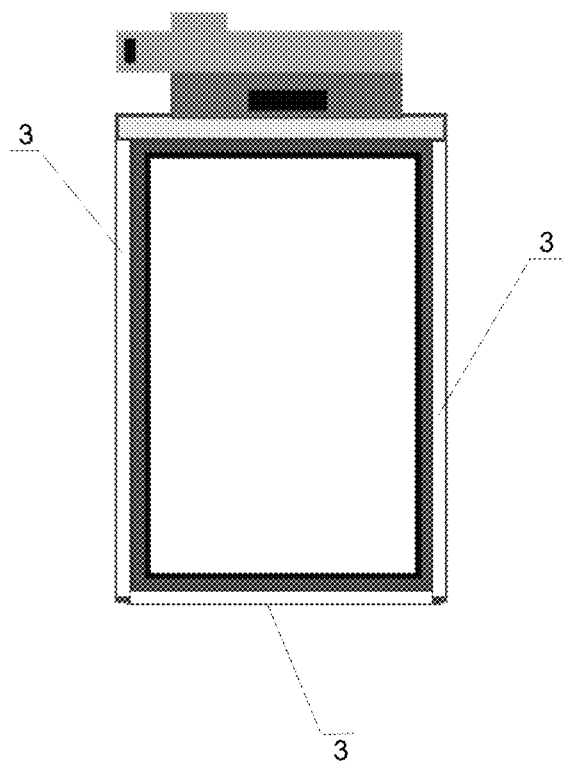
FIG. 4 is a schematic view of a flexible display panel having a coated glue layer according to another embodiment of the disclosure.

Refer to FIG. 1 to FIG. 4. The flexible display panel of an embodiment of the present invention is introduced.

According to an embodiment of the present invention, the flexible display panel comprises a large panel 1 composed of a glass carrier 11 and a polyimide substrate 12 adhering to the glass carrier 11; and displaying effective regional assemblies adhering to the polyimide substrate 12; wherein a glue layer 3 is formed at the periphery of the displaying effective regional assemblies, formed on the polyimide substrate 12, and used to reinforce the edge of the polyimide substrate 12 after the large panel 1 is cut into a display panel.

The large panel 1 has a shape of a rectangle and comprises the glass carrier 11 and the polyimide substrate 12 adhering to the glass carrier 11. Specifically, the large panel 1 comprising the displaying effective regional assemblies is divided into a plurality of independent panels by laser cutting. Afterwards, the glass carrier 11 peels off the polyimide substrate 12.

Before the large panel is divided by laser cutting, the structure of the large panel 1 having the glass carrier 11 and the polyimide substrate 12 is introduced as follows:

The large panel 1 composed of the glass carrier 11 and the polyimide substrate 12 adhering to the glass carrier 11; and the displaying effective regional assemblies adhering to the polyimide substrate 12. The displaying effective regional assemblies further comprises: a thin-film transistor (TFT) layer 21 adhering to the polyimide substrate 12, an organic light-emitting diode (OLED) material layer 22 adhering to the TFT layer 21, a thin film encapsulation layer 23, a touch screen layer 24 adhering to the thin film encapsulation layer 23, an optical adhesive layer 25 adhering to the touch screen layer 24, and a cover layer 26 adhering to the optical adhesive layer 25.

In an embodiment, the thin film encapsulation layer 23 covers the periphery and the top of the OLED material layer 22 and the sidewall 21a of the TFT layer 21 and adheres to the polyimide substrate 12.

In another embodiment, the TFT layer 21 adheres to the top of the polyimide substrate 12, and the OLED material layer 22 adheres to the TFT layer 21, and the thin film encapsulation layer 23 adheres to the OLED material layer 22, and the thin film encapsulation layer 23 does not cover the OLED material layer 22 and/or the TFT layer 21.

Furthermore, in the two abovementioned structures, a glue layer 3 is formed at the periphery of the displaying effective regional assemblies and formed on the polyimide substrate 12. In the embodiment, the glue layer is an ultraviolet glue layer. That is to say, the ultraviolet glue layer is formed on neighboring side regions which are arranged at the periphery of the displaying effective regional assemblies (film package layer 23) and connected with the polyimide substrate 12 and formed on the polyimide substrate 12 which is connected with neighboring side regions arranged at the periphery of the displaying effective regional assemblies (film package layer 23).

The purpose of forming the ultraviolet glue layer is described as follows: Before the glass carrier 11 and the polyimide substrate 12 of the large panel 1 are divided into independent panels, the glass carrier 11 still adheres to the polyimide substrate 12. Firstly, a polarizer adheres to the polyimide substrate 12. Then, a driving IC and a flexible printed circuit board are packaged on the cut panel using packaging techniques. The glass carrier 11 peels off the polyimide substrate 12 by laser scanning, so as to form a display panel. Since the cut edge of the polyimide substrate 12 forms microcracks in the laser cutting process, the microcrack has a width of 20~40 um. As a result, during the glass carrier 11 peels off the polyimide substrate 12, the tension will enlarge and extend microcracks caused by laser cutting to increase the risk for damaging flexible internal traces of the flexible display panel and thin film encapsulation. Therefore, the ultraviolet glue layer formed on three neighboring side regions which are arranged at a periphery of the thin film encapsulation layer and formed on the corresponding polyimide substrate 12 can reinforce the strength of the edge of polyimide substrate 12, decrease the probability that microcracks are extended to the interior, and increase the yield of products.

Preferably, the ultraviolet glue layer is formed on three neighboring side regions which are arranged at the periphery of the thin film encapsulation layer of the displaying effective regional assemblies and connected with the polyamide substrate 12. Also, the ultraviolet glue layer is formed on the polyimide substrate which is connected with three neighboring side regions arranged at the periphery of the displaying effective regional assemblies. Based on guaranteeing the strength of the edge of the polyimide substrate, sufficient spaces are reserved for the driving IC and the flexible printed circuit board, such that the driving IC and the flexible printed circuit board are packaged on the cut panel to improve the assembling efficiency.

In other embodiments, the ultraviolet glue layer is formed on three neighboring side regions which are arranged at the periphery of the OLED material layer 22 and the thin film encapsulation layer 23 that are connected with the polyimide substrate 12/TFT layer 21 and formed on the polyimide substrate 12/TFT layer 21 which is connected with three neighboring side regions arranged at the periphery of the OLED material layer 22 and the thin film encapsulation layer 23.

The present invention provides a method for fabricating the flexible display panel, which comprises: cutting the flexible display panel, the flexible display panel comprises a large panel 1 composed of a glass carrier 11 and a polyimide substrate 12 adhering to the glass carrier 11; and displaying effective regional assemblies adhering to the polyimide substrate 12; and coating an ultraviolet glue layer 3 at the periphery of the displaying effective regional assemblies and on the polyimide substrate 12, so as to reinforce the edge of the polyimide substrate 12 after the large panel is cut into a display panel.

In an embodiment, The displaying effective regional assemblies further comprises: a thin-film transistor (TFT) layer 21 adhering to the polyimide substrate 12, an organic light-emitting diode (OLED) material layer 22 adhering to the TFT layer 21, a thin film encapsulation layer 23, a touch screen layer 24 adhering to the thin film encapsulation layer 23, an optical adhesive layer 25 adhering to the touch screen layer 24, and a cover layer 26 adhering to the optical adhesive layer 25. The thin film encapsulation layer 23 covers the periphery and the top of the OLED material layer 22 and the sidewall 21a of the TFT layer 21 and adheres to the polyimide substrate 12.

In another embodiment, the TFT layer 21 adheres to the top of the polyimide substrate 12, and the OLED material layer 22 adheres to the TFT layer 21, and the thin film encapsulation layer 23 adheres to the OLED material layer 22, and the thin film encapsulation layer 23 does not cover the OLED material layer 22 and/or the TFT layer 21.

Specifically, a ultraviolet glue layer 3 is formed at the periphery of the displaying effective regional assemblies and formed on the polyimide substrate 12.

The purpose of coating the ultraviolet glue layer is described as follows: Before the glass carrier 11 and the polyimide substrate 12 of the large panel 1 are divided into independent panels, the glass carrier 11 still adheres to the polyimide substrate 12. Firstly, a polarizer adheres to the polyimide substrate 12. Then, a driving IC and a flexible printed circuit board are packaged on the cut panel using packaging techniques. The glass carrier 11 peels off the polyimide substrate 12 by laser scanning, so as to form a display panel. Since the cut edge of the polyimide substrate 12 forms microcracks in the laser cutting process, the microcrack has a width of 20~40 um. As a result, during the glass carrier 11 peels off the polyimide substrate 12, the tension will enlarge and extend microcracks caused by laser cutting to increase the risk for damaging flexible internal traces of the flexible display panel and thin film encapsulation. Therefore, the ultraviolet glue layer formed on three neighboring side regions which are arranged at a periphery of the thin film encapsulation layer and formed on the corresponding polyimide substrate 12 can reinforce the strength of the edge of polyimide substrate 12, decrease the probability that microcracks are extended to the interior, and increase the yield of products.

Preferably, the ultraviolet glue layer 3 is formed on three neighboring side regions which are arranged at the periphery of the thin film encapsulation layer of the displaying effective regional assemblies and connected with the polyimide substrate 12. Also, the ultraviolet glue layer is formed on the polyimide substrate which is connected with three neighboring side regions arranged at the periphery of the displaying effective regional assemblies. Based on guaranteeing the strength of the edge of the polyimide substrate, sufficient spaces are reserved for the driving IC and the flexible printed circuit board, such that the driving IC and the flexible printed circuit board are packaged on the cut panel to improve the assembling efficiency.

In other embodiments, the ultraviolet glue layer is formed on three neighboring side regions which are arranged at the periphery of the OLED material layer 22 and the thin film encapsulation layer 23 that are connected with the polyimide substrate 12/TFT layer 21 and formed on the polyimide substrate 12/TFT layer 21 which is connected with three neighboring side regions arranged at the periphery of the OLED material layer 22 and the thin film encapsulation layer 23.

The flexible display panel and the polyimide substrate, and the method for fabricating the flexible display panel of the present invention have following affects:

1. A glue layer is formed at the periphery of the displaying effective regional assemblies and formed on the polyimide substrate and used to reinforce the edge of the polyimide substrate after the large panel is cut into the display panel, thereby improving the strength of the edge of the polyimide substrate after cutting the flexible display panel.

2. A fabrication process is simplified. The probability that microcracks are extended to the interior of the polyimide substrate is controlled to increase the yield of products and decrease the cost.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A polyimide substrate of a flexible display panel, the flexible display panel comprising:
   a to-be-cut panel composed of a carrier glass and a polyimide substrate adhering thereto, and displaying effective regional assemblies adhering to the polyimide substrate;

wherein a glue layer is formed along a periphery of the displaying effective regional assemblies that connected with the polyimide substrate and formed on the polyimide substrate, and used to reinforce an edge of the polyimide substrate after the to-be-cut panel is cut into display panels;

wherein the glue layer is an ultraviolet glue layer, and the ultraviolet glue layer is formed on three neighboring side regions which are arranged at periphery of the displaying effective regional assemblies that connected with the polyimide substrate.

2. The polyimide substrate of the flexible display panel according to claim 1, wherein the ultraviolet glue layer is formed on the polyimide substrate which is connected with the three neighboring side regions arranged at periphery of the displaying effective regional assemblies.

3. The polyimide substrate of the flexible display panel according to claim 2, wherein the displaying effective regional assemblies further comprise: a TFT layer adhering to the polyimide substrate, an OLED material layer adhering to the TFT layer, a thin film encapsulation layer, a touch screen layer adhering to the thin film encapsulation layer, an optical adhesive layer adhering to the touch screen layer, and a cover layer adhering to the optical adhesive layer; wherein the thin film encapsulation layer covers a periphery of the OLED material layer and a sidewall of the TFT layer.

4. The polyimide substrate of the flexible display panel according to claim 3, wherein the thin film encapsulation layer adheres to the polyimide substrate.

5. The polyimide substrate of the flexible display panel according to claim 3, wherein the ultraviolet glue layer is formed on the three neighboring side regions which are arranged at a periphery of the thin film encapsulation layer that connected with the polyimide substrate, and formed on the polyimide substrate which is connected with the three neighboring side regions arranged at the periphery of the thin film encapsulation layer.

6. A method for fabricating a flexible display panel comprising:
cutting a flexible display panel, the flexible display panel comprises a to-be-cut panel composed of a glass carrier and a polyimide substrate adhering to the glass carrier; and displaying effective regional assemblies adhering to the polyimide substrate; and
coating an ultraviolet glue layer at a periphery of the displaying effective regional assemblies and on the polyimide substrate, so as to reinforce an edge of the polyimide substrate after the to-be-cut panel is cut into a display panel.

7. The method for fabricating the flexible display panel according to claim 6, wherein the displaying effective regional assemblies further comprise a thin film encapsulation layer adhering to the polyimide substrate.

8. The method for fabricating the flexible display panel according to claim 7, wherein the ultraviolet glue layer is coated on the three neighboring side regions which are arranged at a periphery of the thin film encapsulation and connected with the polyimide substrate, and the ultraviolet glue layer is coated on the polyimide substrate which is connected with three neighboring side regions arranged at the periphery of the thin film encapsulation.

9. A flexible display panel comprising:
a to-be-cut panel composed of a glass carrier and a polyimide substrate adhering thereto; and
displaying effective regional assemblies adhering to the polyimide substrate; wherein a glue layer is formed at a periphery of the displaying effective regional assemblies, formed on the polyimide substrate, and used to reinforce an edge of the polyimide substrate after the to-be-cut panel is cut into a display panel;
the displaying effective regional assemblies further comprise: a TFT layer adhering to the polyimide substrate, an OLED material layer adhering to the TFT layer, a thin film encapsulation, a touch screen layer adhering to the thin film encapsulation, an optical adhesive layer adhering to the touch screen layer, and a cover layer adhering to the optical adhesive layer, and the thin film encapsulation covers a periphery of the OLED material layer and a sidewall of the TFT layer;
wherein the glue layer is an ultraviolet glue layer as an optical glue layer, and the ultraviolet glue layer is formed on three neighboring side regions which are arranged at the periphery of the displaying effective regional assemblies and connected with the polyimide substrate.

10. The flexible display panel according to claim 9, wherein the ultraviolet glue layer is formed on the polyimide substrate which is connected with three neighboring side regions arranged at the periphery of the displaying effective regional assemblies.

11. The flexible display panel according to claim 10, wherein the thin film encapsulation layer adheres to the polyimide substrate.

12. The flexible display panel according to claim 10, wherein the ultraviolet glue layer is formed on the three neighboring side regions which are arranged at a periphery of the thin film encapsulation layer and connected with the polyimide substrate, and the ultraviolet glue layer is formed on the polyimide substrate which is connected with three neighboring side regions arranged at the periphery of the thin film encapsulation.

* * * * *